(12) United States Patent
Patino et al.

(10) Patent No.: US 8,810,073 B2
(45) Date of Patent: Aug. 19, 2014

(54) SELECTING A POWER PATH BASED ON TEMPERATURE

(75) Inventors: Joseph Patino, Miramar, FL (US); Christopher Simon Book, Waterloo (CA)

(73) Assignee: BlackBerry Limited, Waterloo (CA)

( * ) Notice: Subject to any disclaimer, the term of this patent is extended or adjusted under 35 U.S.C. 154(b) by 878 days.

(21) Appl. No.: 12/944,450

(22) Filed: Nov. 11, 2010

(65) Prior Publication Data

US 2011/0278937 A1 Nov. 17, 2011

Related U.S. Application Data (60) Provisional application No. 61/334,489, filed on May 13, 2010.

(51) Int. Cl.
*H01H 35/00* (2006.01)
*H01H 35/14* (2006.01)
*H01H 37/00* (2006.01)
*H01H 47/24* (2006.01)
*H01H 47/26* (2006.01)

(52) U.S. Cl.
USPC .......................................................... 307/117

(58) Field of Classification Search
USPC .......................................... 307/117; 713/300
See application file for complete search history.

(56) References Cited

U.S. PATENT DOCUMENTS

| 5,230,074 | A | 7/1993 | Canova, Jr. et al. |
| 5,502,838 | A | 3/1996 | Kikinis |
| 6,928,559 | B1 | 8/2005 | Beard |
| 2005/0237030 | A1* | 10/2005 | Takenaka ...................... 320/150 |
| 2008/0113691 | A1* | 5/2008 | Otsuki ........................... 455/573 |
| 2010/0095137 | A1 | 4/2010 | Bieswanger et al. |

FOREIGN PATENT DOCUMENTS

| CA | 2740361 A1 | 11/2011 |
| EP | 1835593 A1 | 9/2007 |
| EP | 0247088 B1 | 12/2009 |
| EP | 2387298 A1 | 11/2011 |
| GB | 2292051 A | 2/1996 |
| GB | 2341247 A | 3/2000 |

OTHER PUBLICATIONS

"European Application Serial No. 10195016.0, EP Search Report dated Sep. 14, 2011", 5 pgs.
"European Application Serial No. 10195016.0, Response filed May 16, 2012 to Extended Search Report mailed Sep. 14, 2011", 4 pgs.

* cited by examiner

*Primary Examiner* — Carlos Amaya
(74) *Attorney, Agent, or Firm* — Hanley, Flight & Zimmerman, LLC.

(57) ABSTRACT

This document discusses, among other things, a method for a portable electronic device comprising measuring a temperature of the portable electronic device and switching a power path for the portable electronic device from an external power source to an internal power pack, such as a battery, based on the temperature of the portable electronic device.

18 Claims, 4 Drawing Sheets

SELECTING A POWER PATH BASED ON TEMPERATURE

CLAIM OF PRIORITY

This patent application claims the benefit of priority, under 35 U.S.C. Section 119(e), to Patino et al. U.S. Provisional Patent Application Ser. No. 61/334,489 entitled "SELECTING A POWER PATH BASED ON TEMPERATURE" filed on May 13, 2010, which is hereby incorporated by reference herein in its entirety.

BACKGROUND

Heat management is a factor in nearly all electronic devices. Heat management can comprise controlling the amount of heat generated as well as adequately dissipating the heat that is generated. These heat management measures can reduce the possibility of overheating of electrical components, and enable compliance with safety standards such as those from Underwriter Laboratories (UL) and the Institute for Electrical and Electronics Engineers (IEEE).

Many different techniques can be used for heat management, and generally multiple different techniques are used in combination. These techniques include selective placement of heat generating components, use of heat sinks on high heat generating components, fans to move air around the device, as well as the design of the device packaging. Continual decreases in device size and increases in heat generation make heat management a continuing challenge during device design.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Modern portable electronic devices often have certain components (e.g., a processor) with scaling voltage domain capabilities. Scaling voltage domains enable a component to be configured to operate off of different input voltage levels. As used herein, a component is generally "configured" to perform a function when the component is capable of carrying out the function. When these components are operating off of a lower voltage, the components consume less power and typically generate less heat. The scalable voltage domain components are typically used to preserve battery life for the portable electronic device. When the portable electronic device is receiving power from the battery, the scalable components operate on a lower voltage and, therefore, consume battery power at a slower rate.

The present inventors have recognized, among other things, a method that utilizes the scaling voltage domain capabilities to manage heat in a portable electronic device. In an example, the method can be used when the portable electronic device is coupled to both an external power source and an internal power pack, such as the battery. For example the method can be used when the portable electronic device is charging the battery with a wall plug-in charger. Other examples include when the portable electronic device is connected to a universal serial bus (USB) to, for example, charge the battery and/or communicate with a computer. Generally speaking, an internal power pack in a portable electronic device is in a unitary structure with the portable electronic device, and may be as portable as the portable electronic device itself. An external power source, by contrast, is generally not a unitary structure with the portable electronic device, is typically more easily engaged with and disengaged from the portable electronic device than an internal power pack, and might not be as portable as the portable electronic device.

The method includes measuring a temperature of the portable electronic device and switching a power path for the portable electronic device between an external power source and the internal power pack based on the temperature. Switching to the internal power pack can cause the scalable voltage components to operate on a lower voltage, consume power at a slower rate, and generate heat at slower rate.

Figure 1:
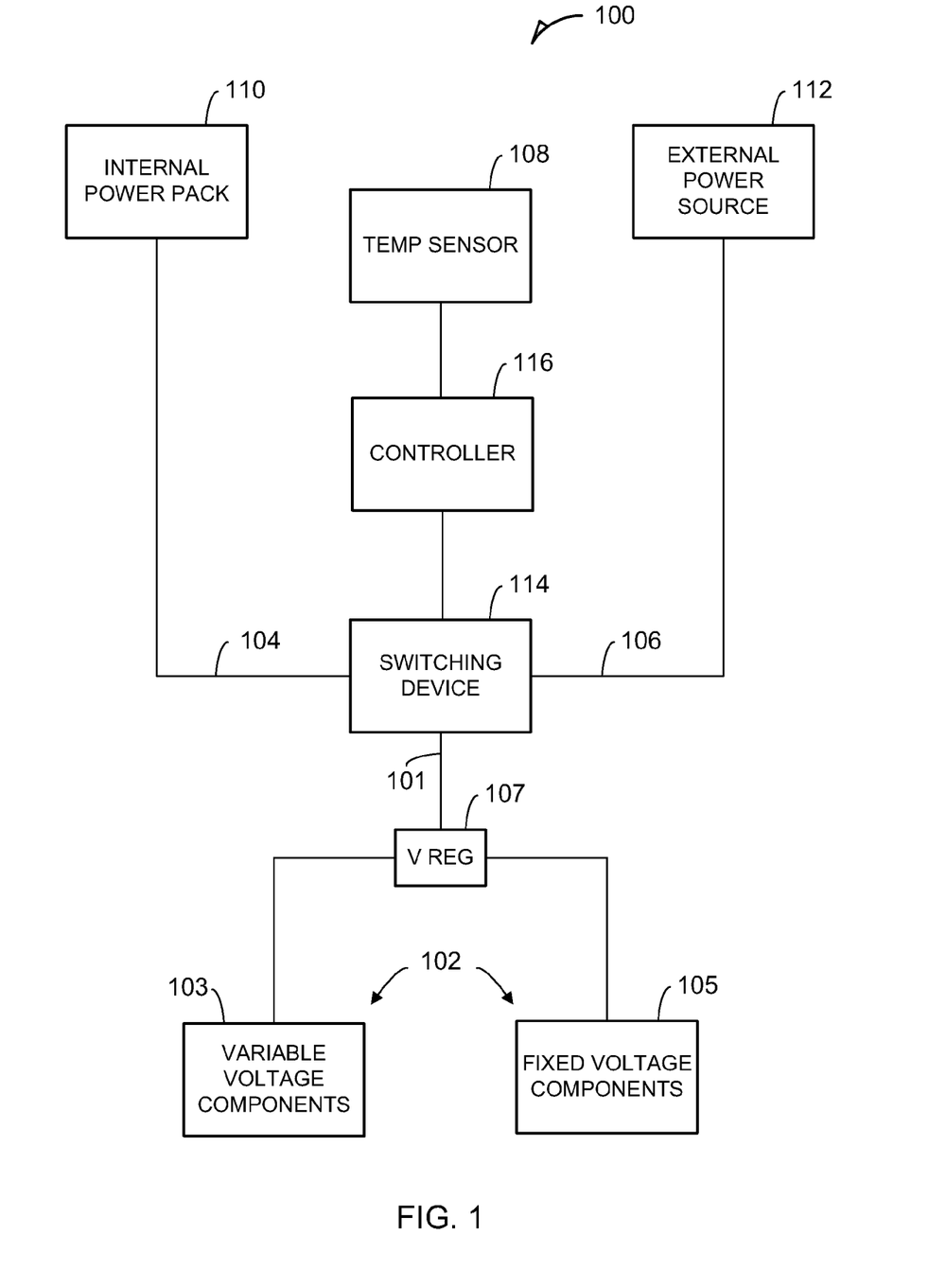
FIG. 1 illustrates generally an example block diagram of a portable electronic device.

FIG. 1 illustrates generally an example block diagram of a portable electronic device 100. The portable electronic device 100 includes a plurality of system components 102 for implementing the functionality of the portable electronic device 100. In an example, the system components 102 can perform the processing, display, transmission, and receiving capabilities, among other things, for the portable electronic device 100. In an example, the portable electronic device 100 can be configured to operate at least partially according to a 3rd Generation Partnership Project (3GPP) based standard. In an example, the wireless network operates according to a Global System for Mobile Communications (GSM) family of a 3GPP based standard. For example, the wireless network can operate according to the Enhanced Data rates for GSM Evolution (EDGE) (also referred to as Enhanced General Packet Radio Service (EGPRS)) standard.

In an example, the portable electronic device 100 can be configured to operate in accordance with one or more frequency bands and/or standards profiles including a Worldwide Interoperability for Microwave Access (WiMAX) standards profile, a WCDMA standards profile, a 3G HSPA standards profile, and a Long Term Evolution (LTE) standards profile. In some examples, the portable electronic device 100 can be configured to communicate in accordance with specific communication standards, such as the Institute of Electrical and Electronics Engineers (IEEE) standards. In particular, the portable electronic device 100 can be configured to operate in accordance with one or more versions of the IEEE 802.16 communication standard (also referred to herein as the "802.16 standard") for wireless metropolitan area networks (WMANs) including variations and evolutions thereof. For example, the portable electronic device 100 can be configured to communicate using the IEEE 802.16-2004, the IEEE 802.16(e), and/or the 802.16(m) versions of the 802.16 standard. In some examples, the mobiles device 100 can be configured to communicate in accordance with one or more versions of the Universal Terrestrial Radio Access Network (UTRAN) Long Term Evolution (LTE) communication standards, including LTE release 8, LTE release 9, and future releases. For more information with respect to the IEEE 802.16 standards, please refer to "IEEE Standards for Information Technology—Telecommunications and Information Exchange between Systems"—Metropolitan Area Networks—Specific Requirements—Part 16: "Air Interface for Fixed Broadband Wireless Access Systems," May 2005 and related amendments/versions. For more information with respect to UTRAN LTE standards, see the 3rd Generation Partnership Project (3GPP) standards for UTRAN-LTE, release 8, March 2008, including variations and later versions (releases) thereof.

In some examples, the portable electronic device 100 can be a personal digital assistant (PDA), a laptop or desktop computer, a web tablet, a net-book, a wireless telephone, a wireless headset, a pager, an instant messaging device, a digital camera, an access point, a television, a medical device (e.g., a heart rate monitor, a blood pressure monitor, etc.), or other electronic device.

In an example, the system components 102 can include one or more variable voltage components 103 having a scalable voltage domain as well as a plurality of fixed voltage components 105. In an example, the variable voltage components 103 can include a processor. Along with the processor, the system components 102 can include a memory device, display controllers, a radio frequency (RF) transceiver, and other electrical components. In an example, the variable voltage components 103 can operate on a low voltage of 4.5 volts or a high voltage of 5.0 volts. To adapt to operate on a lower voltage, the processor may, for example, adjust its speed based on the input voltage. In an example, the variable voltage components 103 consume power at a slower rate and generate heat at a slower rate when operating on a lower voltage. In an example, the temperature of the portable electronic device 100 can drop two (2) degrees Celsius when the variable voltage components 103 operate from a lower voltage.

The system components 102 receive power from an input power path 101. The input power path 101 can be selectively coupled to one of the source power paths 104, 106 by a switching device 114. In general, "coupling" as used herein refers to a physical relation of components such that coupled components can provide (or supply) power, consume power, or convey power. The source power paths 104, 106 are configured to be coupled to one or more power sources to enable the power sources to provide power over a power path such as power path 101, which conveys or assigns in conveying the power, to the system components 102, which consume or use the power. In an example, the first source power path 104 is configured to be coupled to an internal power pack 110 for the portable electronic device 100. In an example, the second source power path 106 is configured to be coupled to one or more external power sources 112. In an example, the internal power pack 110 can include a re-chargeable lithium-ion battery, a rechargeable nickel-cadmium battery, a fuel cell, or other portable power source. The internal power pack 110 can also include a "smart battery" having circuits for protecting the battery from excessive current discharge, overcharging, and overheating, among other things. The concepts discussed herein may be applicable to internal power packs that are not batteries, as well as to internal power packs that include one or more batteries in conjunction with other power sources. For example, concepts may be applicable to internal power packs that include a fuel cell or a fuel tank or both.

The external power source 112 can include a universal serial bus (USB) controller (e.g., on a general purpose computer), an IEEE 1394 controller, an alternating current (AC) source (e.g., line power), a wireless charger, and other power sources. In an example, a voltage regulator 107 is coupled to the input power path 101 and is configured to condition the power received from the source power paths 104, 106 for use by the system components 102. The voltage regulator 107 can be configured to provide a high voltage (e.g., 5.0 V) to the variable voltage components 103 when the switching device 114 is set to couple the source power path 106 for the external power source 112 to the input power path 101. When the switching device 114 is set to couple to the source power path 104 for the internal power pack 110 to the input power path 101, the voltage regulator 107 can be configured to provide a low voltage (e.g., 4.5 V) on the variable voltage components 103. In an example, the voltage regulator 107 can be configured to provide a fixed voltage to the fixed voltage components 105 regardless of whether power is being received from the internal power pack 110 or the external power source 112. The voltage regulator 107 can be any kind of voltage regulator, such as a switching regulator.

The switching device 114 can include one or more switches that can be implemented with a transistor (e.g., a field effect transistor (FET)), a relay, or other switching device. The switching device 114 is controlled by a controller 116 that receives temperature measurements from one or more temperature sensors 108. The controller 116 may be, for example, a processor that controls the overall operation of the portable electronic device 100, or a component dedicated to receiving temperature measurements from a temperature sensor 108 and controlling the switching device 114. The temperature sensor 108 measures the temperature of an area on the portable electronic device 100 surrounding the temperature sensor 108. In an example, the temperature sensor 108 is integrated into the internal power pack 110 and measures a temperature of the internal power pack 110. This battery integrated temperature sensor 108 can send temperature measurement data to the controller 116 via a battery data link. In another example, the temperature sensor 108 obtains measurements from an area near one or more of the system components 102. For example, the temperature sensor 108 can obtain measurements near a processor or a radio frequency power amplifier. In yet another example, the controller 116 receives measurements from multiple temperature sensors 108 located in various locations on the portable electronic device 100. As an example, a first temperature sensor 108 may obtain measurements from the internal power pack 110 and a second temperature sensor 108 may obtain measurement in the area around one or more of the system components 102. As used herein, a temperature sensor 108 measures a temperature by receiving as input a sensed temperature of, e.g., the internal power pack 110 and by issuing as output a temperature signal, which is received by the controller 116. The temperature signal is generally a function of the temperature of the internal power pack 110. The temperature signal may be, for example, an electrical signal that changes as a function of the sensed temperature of the internal power pack 110. In some examples, the temperature signal may convey a plurality of temperatures. In other examples, the temperature signal may comprise a logical signal that, for example, goes high when the sensed temperature is above a temperature threshold, and is otherwise low.

In operation, the controller 116 can receive temperature measurements from the temperature sensor 108 and control the switching device 114 based on the temperature measurements. By controlling the switching device 114, the controller 116 can control whether the system components 102 are powered by the first source power path 104 or the second source power path 106. Accordingly, the switching device 114 can control whether the system components 102 are operating from a high voltage or a lower voltage.

Figure 2:
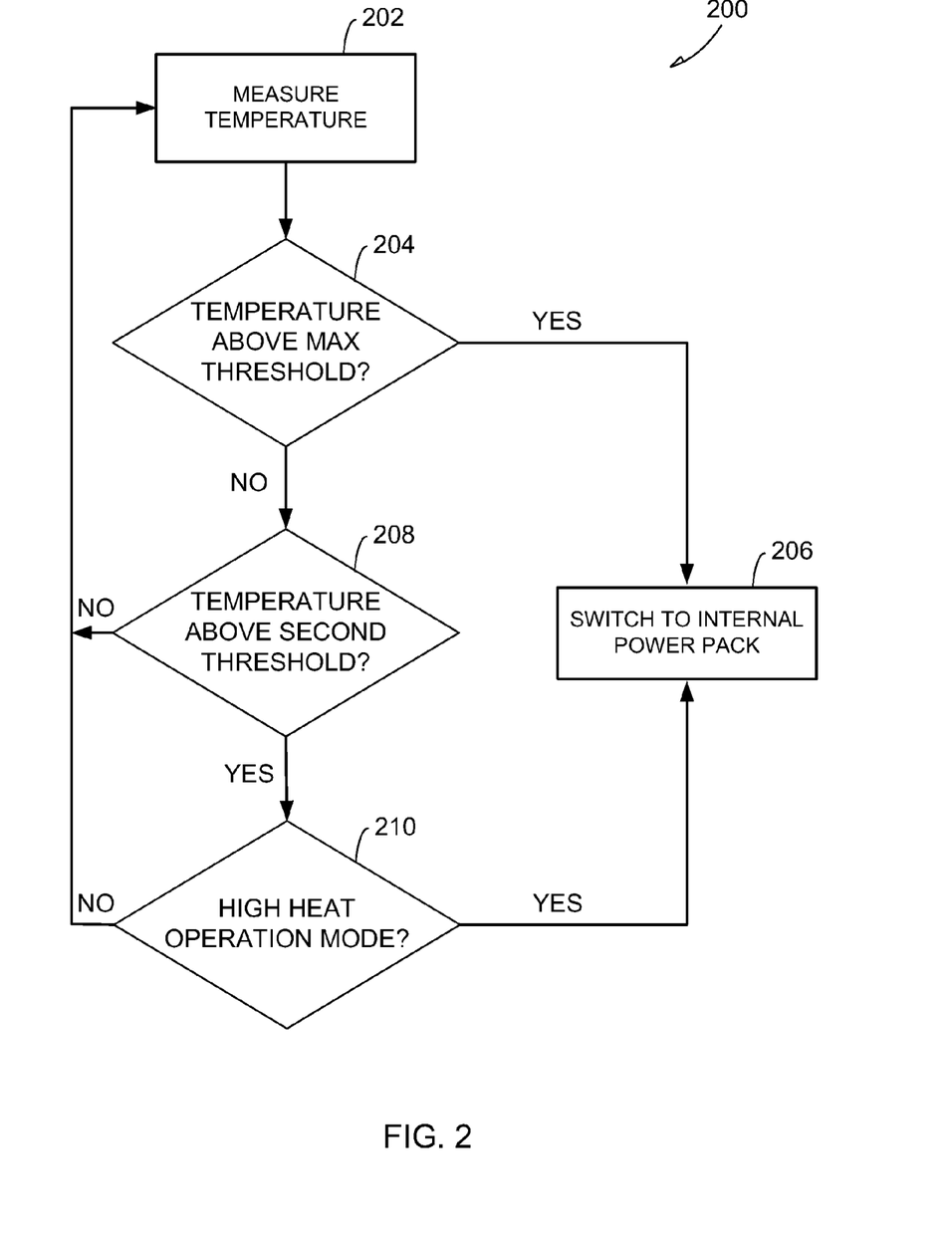
FIG. 2 illustrates generally an example flow chart for managing heat in a portable electronic device.

FIG. 2 illustrates an example flowchart for a method 200 of heat management on the portable electronic device 100. The method 200 manages heat on the portable electronic device 100 by controlling the input power for the variable voltage components 103. As mentioned above, when the variable voltage components 103 operate on a lower voltage, the variable voltage components 103 consume power at a slower rate and generate heat at a slower rate. Accordingly, the input power for the variable voltage components 103 can be used to control the heat generated by the portable electronic device 100.

Method 200 begins at 202 where a temperature of the portable electronic device 100 is measured with a temperature sensor 108. In an example, the temperature sensor 108 is integrated into the internal power pack 110 and obtains a temperature measurement of the internal power pack 110. In other examples, the temperature sensor 108 obtains a temperature measurement from another location on the portable electronic device 100. In yet other examples, a plurality of temperature sensors 108 obtain measurements from a plurality of locations on the portable electronic device 100. The temperature measurements from the temperature sensor 108 are sent to the controller 116.

The controller 116 can control the input power for the variable voltage components 103 based on the temperature measurement from the temperature sensor 108. In an example, the input power is controlled by setting the switching device 114. When the switching device 114 is set to couple the first power path 104 and the internal power pack 110 to the input power path 101, the voltage regulator is configured to provide a low voltage to the variable voltage components 103. When the switching device 114 is set to couple the second power path 106 and the external power sources 112 to the input power path 101, the voltage regulator is configured to provide a high voltage to the variable voltage components 103. Accordingly, by controlling the setting of the switching device 114, the controller 116 can control the input power for the variable voltage components 103.

At 204, the controller 116 determines whether the temperature is above a first threshold, which will be referred to as the max threshold. In an example, the max threshold corresponds to a maximum allowable temperature for the portable electronic device 100. In an example, the maximum allowable temperature may be set by one or more regulations (e.g., UL, IEEE standards) to which the portable electronic device 100 is subject. These regulations can establish maximum limits for the outer temperature at any location on the portable electronic device 100. The maximum allowable temperature can also be set based on operational limits for components on the portable electronic device 100. In some examples, the maximum allowable temperature can be specific to a certain location (e.g., the battery) on the portable electronic device 100.

In an example, the max threshold can be at or slightly below the maximum allowable temperature. For example, if the maximum allowable temperature is 75 degrees Celsius, the max threshold can be set at 73 degrees Celsius to account for residual heating after attempting to control the heat generation, environmental influences, or other concerns. In another example, the max threshold can be considerably lower than the maximum allowable temperature to, for example, account for temperature variation across the device. For example, due to temperature variation and placement of the temperature sensor 108, temperatures measured by the temperature sensor 108 may differ from the actual highest temperature on the portable electronic device 100. For example, a common location for the warmest area on the portable electronic device 100 is near the RF power amplifier. Due to placement of the temperature sensor 108, however, it may not be able to measure the temperature near the RF power amplifier directly. Accordingly, in order to maintain the temperature of the warmest area(s) at or below a maximum allowable temperature, the max threshold may be set to account for differences from the temperature at the temperature sensor 108 and the temperature of the warmest area(s) on the portable electronic device 100. In an example, the max threshold can be based on empirical data that relates the temperature measured by the temperature sensor 108 to the warmest area(s) on the portable electronic device 100. Thus, the max threshold can be set based on a temperature at the temperature sensor 108 that corresponds to a highest desired temperature at the warmest area(s).

In an example, the controller 116 can receive temperature measurements from multiple temperature sensors 108, and can have different max thresholds for each temperature sensor 108 based on their location within the portable electronic device 100, such that any measurement above its respective max threshold may be deemed a temperature above the max threshold. In another example, the controller 116 can combine (e.g., average) temperature measurements from multiple temperature sensors 108 to form a composite temperature and compare the composite temperature to a max threshold.

At 206, when the temperature measurement from the temperature sensor 108 is above the max threshold, the controller 116 attempts to reduce the heat generated by the portable electronic device 100 by setting the switching device 114 to couple power from the internal power pack 110 to the system components 102. When the temperature measurement from the temperature sensor 108 is below the max threshold, the controller 116 can set (or maintain) the switching device 114 to couple power from the external power source 112 to the system components 102. Accordingly, the controller 116 causes the variable voltage components 103 to operate on lower voltage when the temperature measurement rises to the max threshold. When the temperature measurement is below the max threshold, the controller 116 allows the variable voltage components 103 to operate on a higher voltage to improve performance of the portable electronic device 100 subject to blocks 208 and 210 discussed below.

At 208 and 210, the controller 116 determines whether the temperature from the temperature sensor 108 is above a second threshold, and whether the portable electronic device 100 is in an operational mode that can generate a large amount of heat. In an example, the operation mode can be used to predict the difference between the temperature measured by the temperature sensor 108 and the high temperature of the warmest area(s) for the portable electronic device 110. For example, when the portable electronic device 100 is transmitting the temperature measured by the temperature sensor 108 on the internal power pack 110 may be 20 degrees Celsius below the temperature near the RF power amplifier. When the portable electronic device 100 is not transmitting, however, the temperature measured from the internal power pack 110 may be less than 5 degrees below the temperature near the RF power amplifier. Accordingly, the controller 116 can also control the input voltage level of the variable voltage components 103 based in part on the operation mode for the portable electronic device 100. For example, when the portable electronic device 100 is being used in an operation mode where the system components 102 generate larger amounts of heat, and when the temperature measured by the temperature sensor 108 is above a second threshold, the controller 116 can cause the variable voltage components 103 to operate on the lower voltage. In an example, the second threshold temperature can be determined in an empirical manner with respect to the warmest area(s) similar to that discussed above for the max threshold.

Example operation modes when the system components 102 generate larger amounts of heat include when the portable electronic device 100 is transmitting, frequently updating the display, or performing intensive processing. For example, the system components 102 can generate considerably more heat when transmitting due, in part, to the heat generated by the RF power amplifier. These operation modes that generate a large amount of heat are in contrast to the operation modes that generate a low amount of heat such as when the portable electronic device 100 is idle or in standby. In an example, an operation mode can include when the portable electronic device 100 is currently or imminently transmitting (e.g., during a telephone call). Examples of when the screen may be frequently updated include when the portable electronic device 100 is browsing the internet, browsing stored images, or the like. Intensive processing can include when the portable electronic device 100 is executing a video game.

In an example, the controller 116 can control the input voltage based on both the max threshold without consideration of the operation mode of the portable electronic device 100, and the second threshold with consideration of the operation mode for the portable electronic device 100. In an example, the second threshold is set at a lower temperature than the max threshold to account for increased temperature created by the system components 102 during the high heat operation modes.

When the temperature is below the second threshold, the controller 116 can set (or maintain) the switching device 114 to couple power from the external power source 112 to the system components 102. When the temperature is between the second threshold and the max threshold and when the portable electronic device 100 is in an operation mode that can generate a large amount of heat, the controller 116, at 206, can set the switching device 114 to couple power from the internal power pack 110 to the system components 102. When the temperature is between the second threshold and the max threshold and the portable electronic device 100 is not in an operation mode that can generate a large amount heat, the controller 116 can set (or maintain) the switching device 114 to couple power from the external power source 112 to the system components 102. When the temperature is above the max threshold, the controller 116, at 206, can set the switching device 114 to couple power from the internal power pack 110 to the system components 102 regardless of the operation mode of the portable electronic device 100. In an example, the maximum allowable temperature for the warmest area(s) on the portable electronic device 100 is 75 degrees Celsius, the max threshold is set at 55 degrees Celsius, and the second threshold is set at 45 degrees Celsius.

Figure 3:
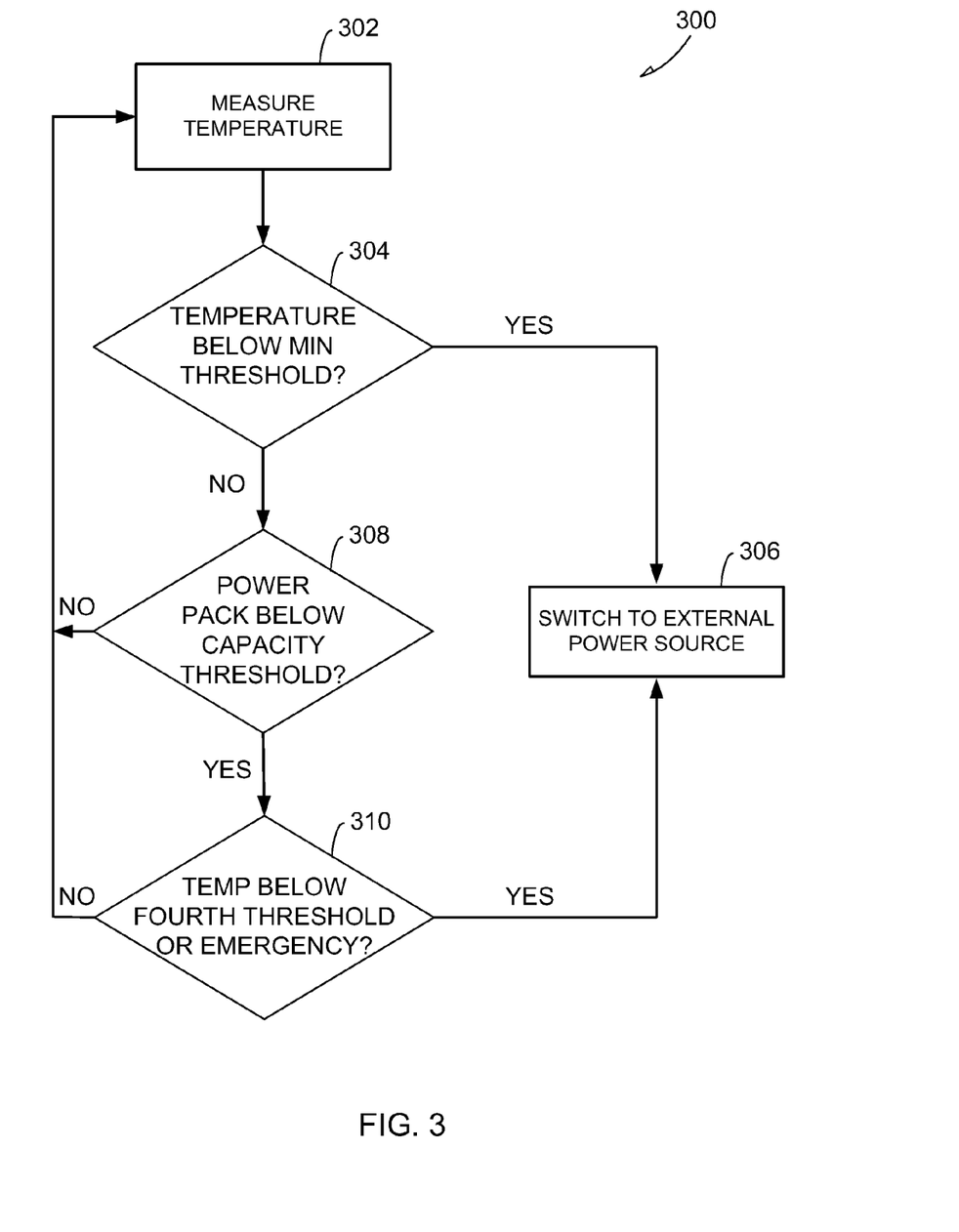
FIG. 3 illustrates generally an example flow chart for managing heat in a portable electronic device.

In an example, once method 200 reaches 206 and switches the switching device 114 to couple the internal power pack 110 to the system components 102, the method 200 proceeds to method 300 of FIG. 3 to determine whether to switch back to the external power source 112.

FIG. 3 illustrates an example flowchart for a method 300 of heat management on the portable electronic device 100. The method 300 switches the switching device 114 to couple the external power source 112 to the system components 102 under certain circumstances.

Method 300 begins at 302 where a temperature of the portable electronic device 100 is measured with a temperature sensor 108. In an example, the temperature sensor 108 is integrated into the internal power pack 110 and obtains a temperature measurement of the internal power pack 110. In other examples, the temperature sensor 108 obtains a temperature measurement from another location on the portable electronic device 100. In yet other examples, a plurality of temperature sensors 108 obtain measurements from a plurality of locations on the portable electronic device 100. The temperature measurements from the temperature sensor 108 are sent to the controller 116.

At 304, the controller 116 determines whether the temperature from the temperature sensor 108 is below a third threshold, which will be referred to herein as the min threshold. In an example, the min threshold is a single temperature (e.g., 40 degrees Celsius). In another example, the min threshold is a relative to the max threshold and/or the second threshold discussed above. For example, the min threshold can be set at 2 degrees Celsius lower than the max threshold.

In another example, the min threshold can depend on the operation mode of the portable electronic device 100. When the portable electronic device 100 is in an operation mode that can generate a large amount of heat, the min threshold can be relative to the second threshold. When the portable electronic device 100 is in an operation mode that does not typically generate a large amount of heat, the min threshold can be relative to the max threshold. For example, when the portable electronic device 100 is in an operation mode that can generate a large amount of heat, the min threshold can be 2 degrees Celsius less than the second threshold. When the portable electronic device 100 is in an operation mode that does not typically generate a large amount of heat, the min threshold can be 2 degrees Celsius less than the max threshold.

At 306, when the temperature measurement from the temperature sensor 108 is below the min threshold, the controller 116 can increase the potential performance for the portable electronic device 100 by setting the switching device 114 to couple power from the external power source 112 to the system components 102. When the temperature measurement form the temperature sensor 108 is above the min threshold, the controller 116 can maintain the switching device 114 to couple power from the internal power pack 110 to the system components 102 subject to blocks 308 and 310 below. Accordingly, the controller 116 causes the variable voltage components 103 to operate on higher voltage when the temperature measurement drops to the min threshold.

At 308, the controller 116 determines whether the internal power pack 110 is below a low capacity threshold. Unlike some other threshold, which may be a function of temperature, the low capacity threshold is a function of power remaining in the internal power pack 110. In an example, the low capacity threshold of the internal power pack 110 includes a remaining charge (e.g., 10% in relation to fully charged 100%) for the internal power pack 110. In another example, the low capacity threshold includes a certain amount of capacity used since the switching device 114 was set, at 206, to couple the internal power pack 110 to the system components 102. For example, the low capacity threshold can be set to 2% of capacity used since the system components 102 began drawing from the internal power pack 110. In other examples, other thresholds can be used. The capacity of the internal power pack 110 can be determined by measuring a voltage present for the internal power pack 110 and comparing the voltage to a table to translate the voltage to a percentage of remaining capacity. The capacity of the internal power pack 110 can also be determined using a coulomb counter to count the amount of energy that has been removed from the internal power pack 110.

When the capacity of the internal power pack 110 is above the low capacity threshold, the controller 116 can maintain the switching device 114 to couple the internal power pack 110 to the system components 102. When the capacity of the internal power pack 110 is at or below the low capacity threshold, the controller 116 can determine whether the switching device 114 should switch to the external power source 112, at 310.

At 310, the controller 116 determines whether either the temperature from the temperature sensor 108 is below a fourth threshold, or whether the portable electronic device 100 is in an emergency mode. In an example, the fourth threshold is equal to the max threshold discussed above with respect to FIG. 2. In another example, the fourth threshold can depend on the operation mode of the portable electronic device 100. For example, when the portable electronic device 100 is in an operation mode that can generate a large amount of heat, the fourth threshold can be equal to the second threshold. When the portable electronic device 100 is in an operation mode that does not typically generate a large amount of heat, the fourth threshold can be equal to the max threshold. In other examples, other thresholds can be used. At 306, when the capacity of the internal power pack 110 is below a low capacity threshold and the temp is below the fourth threshold, the controller 116 can set the switching device 114 to couple the external power source 112 to the system components 102.

In an example, when the capacity for the internal power pack 110 is at the low capacity threshold, and the temperature is still above the fourth threshold to allow switching back to the external power source 112, the system components 102 remain powered by the internal power pack 110. In certain examples, however, the controller 116 can switch the switching device 114 back to couple the power source 112 to the system components 102. For example, when the portable electronic device 100 is in an emergency mode, the controller 116 can couple the power source 112 to the system components 102 to ensure that the portable electronic device 100 continues to operate. In an example, an emergency mode can include when the portable electronic device 100 is on a "911" call. As an example, when the portable electronic device 100 is in the emergency mode, the portable electronic device 100 may be allowed to operate above the max threshold for temperature. In an example, when the internal power pack 110 has reached a minimum capacity threshold for operating the portable electronic device 100 and the temperature is still above the fourth threshold, the user can be notified and the portable electronic device 100 can be powered down or set into a standby mode.

In an example, the system components 102 can be switched between receiving power from the internal power pack 110 and the external power source 112 subject to any combination of the above criteria. In certain examples, any of the thresholds discussed above can be variable with respect to time. That is, one or more of the thresholds discussed above may be set at a first value at a first time and a second value at a second time. Additionally, any of the methods discussed above may be subject to additional thresholds or other controls for the portable electronic device 100. For example, the internal power pack 110 may have internal controls that limit the charging and/or discharging under certain circumstances (e.g., overcharging, overheating, over-discharging, etc.). Another control that the above methods may be subject to includes, open circuiting the second power path 106 under certain circumstances including when the external power supply 112 is off (not presently providing power), and when the external power supply 112 is providing too high of a voltage. Additionally, any of the above heat management techniques may be used in combination with other heat management techniques including, heat sinks, fans, coolers, etc.

Figure 4:
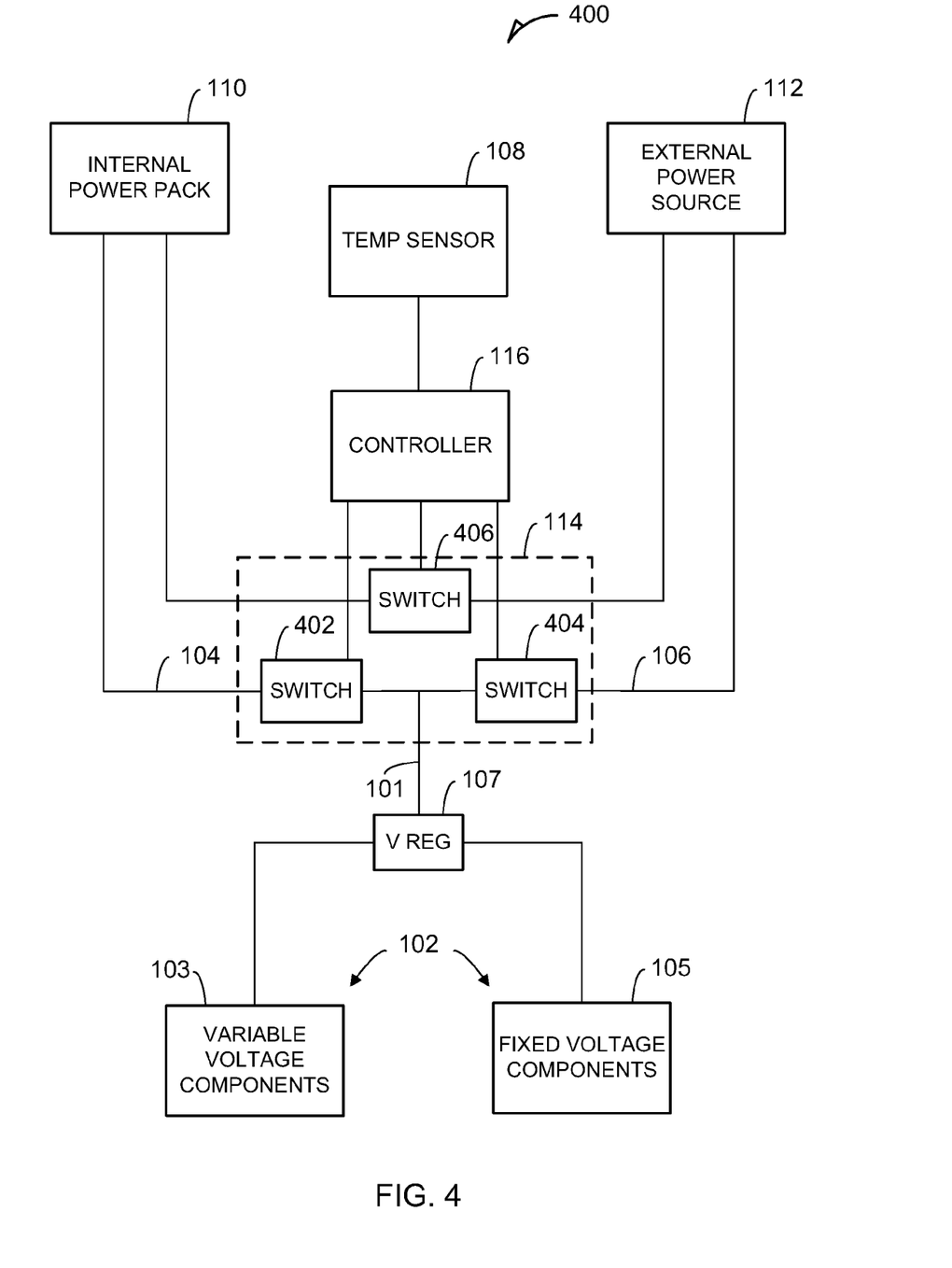
FIG. 4 illustrates generally an example block diagram of a portable electronic device.

FIG. 4 illustrates an example of a block diagram for a portable electronic device 400. In an example, the portable electronic device 400 includes system components 102, voltage regulator 107, internal power pack 110, external power source 112, temp sensor 116, and controller 108 similar to that described with respect to FIG. 1. Additionally, the switching device 114 includes a plurality of switches 402, 404, 406 that can be individually controlled by the controller 116. In an example, each of the switches 402, 404, 406 comprises a transistor (e.g., a FET) that can be opened to open circuit the connection or closed to couple the two connections together.

A first switch 402 can selectively couple the first power path 104 from the internal power pack 110 to the system components 102. A second switch 404 can selectively couple the second power path 106 from the external power sources 112 to the system components 102. A third switch 406 can selectively couple the external power source 112 to the internal power pack 110 for charging of the internal power pack 110. Since charging the internal power pack 110 can increase the heat generated by the internal power pack 110, the controller 116 may open circuit switch 406 to prevent the internal power pack 110 from charging when the temperature is at or above a given threshold. In some examples this battery charging threshold can be similar to the max or second threshold discussed above. In other examples, the battery charging threshold can set a value different than those listed above. In some examples, switch 406 may be included in a power management circuit (not shown) that controls charging of the internal power source 110 by the external power source 112.

In an example, while the system components 102 are receiving power from the external power source 112 (e.g., switch 404 is closed), switch 406 can be closed to charge the internal power pack 110 from the external power source 112. Accordingly, the temperature of the portable electronic device 110 and the charge present in the internal power pack 110 can be maintained by toggling the system components 102 back and forth between operating from the internal power pack 110 and the external power source 112. That is, the controller 116 can switch the system components 102 to receive power from the internal power pack 110 when the temperature rises. This, however, will drain power from the internal power pack 110. Accordingly, after a period of time the controller 116 can switch the system components 102 to receive power from the external power sources 112 and at the same time charge the internal power pack 110. This, however, can increase the temperature of the portable electronic device 100. Thus, after another period of time the controller 116 can switch back to the internal power pack 110, which has now be at least partially recharged.

Example Embodiments

Example 1 includes a method including measuring a temperature of a portable electronic device and switching a power path for a portable electronic device from an external power source to an internal power pack based on the temperature of the portable electronic device.

In Example 2, the subject matter of Example 1 can optionally include wherein switching when the temperature reaches a first threshold.

In Example 3, the subject matter of any one of Examples 1 and 2 can optionally include switching when the temperature reaches a second threshold and when the portable electronic device is in a high heat operation mode.

In Example 4, the subject matter of any one of Examples 1-3 can optionally include switching the power path back to the external power source when the temperature drops to a third threshold.

In Example 5, the subject matter of any one of Examples 1-4 can optionally include switching the power path back to the external power source when the internal power pack reaches a low capacity threshold and when the temperature is below a fourth threshold.

In Example 6, the subject matter of any one of Examples 1-5 can optionally include switching the power path back to the external power source when the internal power pack reaches a low capacity threshold and when the portable electronic device is in an emergency mode.

In Example 7, the subject matter of any one of Examples 1-6 can optionally include wherein the internal power pack comprises a battery and wherein measuring the temperature includes measuring a temperature of the battery.

Example 8 includes a portable electronic device having a temperature sensor configured to measure a temperature of the portable electronic device and a controller configured to switch a power path for the portable electronic device from an external power source to an internal power pack based on the temperature of the portable electronic device.

In Example 9, the subject matter of Example 8 can optionally include wherein the controller is configured to switch when the temperature reaches a threshold.

In Example 10, the subject matter of any one of Examples 8-9 can optionally include wherein the controller is configured to switch when the temperature reaches a threshold and when the device is in a high heat operation mode.

In Example 11, the subject matter of any one of Examples 8-10 can optionally include wherein the controller is configured to switch the power path back to the external power source when the temperature drops to a threshold.

In Example 12, the subject matter of any one of Examples 8-11 can optionally include wherein the controller is configured to switch the power path back to the external power source when the internal power pack reaches a low capacity threshold and when the temperature is below a threshold.

In Example 13, the subject matter of any one of Examples 8-12 can optionally include wherein the controller is configured to switch the power path back to the external power source when the internal power pack reaches a low capacity threshold and the portable electronic device is in an emergency mode.

In Example 14, the subject matter of any one of Examples 8-13 can optionally include wherein the internal power pack comprises a battery and wherein the temperature sensor is configured to measure a temperature of the battery.

Example 15 includes a method heat management in a portable electronic device. The method includes measuring a temperature of the portable electronic device. The method also includes selecting whether the portable electronic device receives power from an external power source or an internal power pack as a function of the temperature of the portable electronic device, wherein system components for the portable electronic device operate on a lower voltage when the portable electronic device receives power from the internal power pack than when the portable electronic device receives power from the external power source.

In Example 16, the subject matter of Example 15 can optionally include selecting the internal power pack when the temperature is above a first threshold.

In Example 17, the subject matter of any one of Examples 15-16 can optionally include selecting the internal power pack when the temperature is above a second threshold and when the portable electronic device is in a high heat operation mode.

In Example 18, the subject matter of any one of Examples 15-17 can optionally include selecting the external power source when the temperature is below a third threshold.

In Example 19, the subject matter of any one of Examples 15-18 can optionally include selecting the external power source when the internal power pack reaches a low capacity threshold and when the temperature is below a fourth threshold.

In Example 20, the subject matter of any one of Examples 15-19 can optionally include selecting the external power source when the internal power pack reaches a low capacity threshold and when the portable electronic device is in an emergency mode.

In Example 21, the subject matter of any one of Examples 15-20 can optionally include measuring a temperature of the internal power pack.

Additional Notes

The above detailed description includes references to the accompanying drawings, which form a part of the detailed description. The drawings show, by way of illustration, specific embodiments in which the subject matter can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Further, it is contemplated that the apparatus and methods described herein may be employed in concert with or in the alternative to other temperature-related control of the portable electronic device. For example, the apparatus and methods described herein generally do not exclude other apparatus or techniques for managing heat, improving safety or controlling power.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the claims should be determined with reference to the appended claims, along with the full scope of equivalents to which such claims are entitled.

What is claimed is:

1. A method comprising:
measuring a temperature of a portable electronic device; switching a power path for the portable electronic device from an external power source to an internal power pack based on the temperature of the portable electronic device, including switching to the internal power back when the temperature reaches a first threshold.

2. The method of claim 1, wherein the switching further includes switching to the internal power pack when the temperature reaches a second threshold and when the portable electronic device is in a high heat operation mode.

3. The method of claim 1, further comprising:
switching the power path back to the external power source when the temperature drops to a third threshold.

4. The method of claim 1, further comprising:
switching the power path back to the external power source when the internal power pack reaches a low capacity threshold and when the temperature is below a fourth threshold.

5. The method of claim 1, further comprising:
switching the power path back to the external power source when the internal power pack reaches a low capacity threshold and when the portable electronic device is in an emergency mode.

6. The method of claim 1, wherein the internal power pack comprises a battery and wherein measuring the temperature includes measuring a temperature of the battery.

7. A portable electronic device comprising:
a temperature sensor configured to measure a temperature of the portable electronic device; and
a controller configured to switch a power path for the portable electronic device from an external power source to an internal power pack based on the temperature of the portable electronic device, including switching to the internal power pack when the temperature reaches a threshold.

8. The portable electronic device of claim 7, wherein the controller is further configured to switch to the internal power pack when the temperature reaches a threshold and when the device is in a high heat operation mode.

9. The portable electronic device of claim 7, wherein the controller is further configured to:
switch the power path back to the external power source when the temperature drops to a threshold.

10. The portable electronic device of claim 7, wherein the controller is further configured to:
switch the power path back to the external power source when the internal power pack reaches a low capacity threshold and when the temperature is below a threshold.

11. The portable electronic device of claim 7, wherein the controller is further configured to:
switch the power path back to the external power source when the internal power pack reaches a low capacity threshold and the portable electronic device is in an emergency mode.

12. The portable electronic device of claim 7, wherein internal power pack comprises a battery and wherein the temperature sensor is configured to measure a temperature of the battery.

13. A method for heat management in a portable electronic device, the method comprising:
measuring a temperature of the portable electronic device; and
selecting whether the portable electronic device receives power from an external power source or an internal power pack as a function of the temperature of the portable electronic device, including selecting the internal power pack when the temperature is above a first threshold, wherein system components for the portable electronic device operate on a lower voltage when the portable electronic device receives power from the internal power pack than when the portable electronic device receives power from the external power source.

14. The method of claim 13, wherein selecting further includes selecting the internal power pack when the temperature is above a second threshold and when the portable electronic device is in a high heat operation mode.

15. The method of claim 13 wherein selecting further includes selecting the external power source when the temperature is below a third threshold.

16. The method of claim 13, wherein selecting further includes selecting the external power source when the internal power pack reaches a low capacity threshold and when the temperature is below a fourth threshold.

17. The method of claim 13, wherein selecting further includes selecting the external power source when the internal power pack reaches a low capacity threshold and when the portable electronic device is in an emergency mode.

18. The method of claim 13, wherein measuring the temperature includes measuring a temperature of the internal power pack.

* * * * *